(12) United States Patent
Huang

(10) Patent No.: US 6,483,711 B1
(45) Date of Patent: Nov. 19, 2002

(54) OPTOELECTRONIC TRANSCEIVER MODULE WITH ADDITIONAL GROUNDING

(75) Inventor: Nan Tsung Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/939,157

(22) Filed: Aug. 24, 2001

(30) Foreign Application Priority Data

Jun. 6, 2001 (TW) .................................... 090209365 U

(51) Int. Cl.[7] .............................. H05K 7/00; H05K 7/14
(52) U.S. Cl. ...................... 361/736; 361/728; 361/740; 361/759; 361/752; 361/799; 361/811; 439/377; 385/92
(58) Field of Search ................................ 361/728, 736, 361/740, 752, 753, 759, 796, 797, 799, 801; 174/51; 439/377; 385/88, 92

(56) References Cited

U.S. PATENT DOCUMENTS

| | | | | |
|---|---|---|---|---|
| 4,717,990 A | * | 1/1988 | Tugcu | 174/35 R |
| 5,767,999 A | * | 6/1998 | Kayner | 359/152 |
| 6,031,732 A | * | 2/2000 | Koike et al. | 174/35 R |
| 6,058,024 A | * | 5/2000 | Lyford | 174/35 R |
| 6,062,893 A | * | 5/2000 | Miskin et al. | 439/374 |
| RE36,820 E | * | 8/2000 | McGinley et al. | 361/752 |

* cited by examiner

Primary Examiner—Jayprakash N. Gandhi
(74) Attorney, Agent, or Firm—Wei Te Chung

(57) ABSTRACT

A transceiver module which is easily and conveniently assembled, and which is reliable. The transceiver module comprises a housing, an optoelectronic subassembly, a receptacle, a chassis and a PCB. The optoelectronic subassembly is received in the receptacle. Conductive leads of the optoelectronic subassembly are soldered to the PCB. The chassis is attached to the PCB with screws, and accommodates and protects the PCB. The housing comprises a top housing and a bottom housing. The top housing is attached to the chassis and the receptacle. The top housing and bottom housings are attached together, enclosing therein the receptacle, the chassis and the PCB.

12 Claims, 4 Drawing Sheets

OPTOELECTRONIC TRANSCEIVER MODULE WITH ADDITIONAL GROUNDING

BACKGROUND OF THE INVENTION

1. Field of the Invention

The present invention generally relates to optoelectronic transceiver modules for fiber-optic communications, and in particular optoelectronic transceiver modules which can be conveniently assembled and which are reliable.

2. Description of the Related Art

Optoelectronic transceiver modules provide for bi-directional transmission of data between an electrical interface and an optical data link. The module receives electrically encoded data signals which are converted into optical signals and transmitted over the optical data link. Conversely, the module receives optically encoded data signals which are converted into electrical signals and transmitted onto the electrical interface.

There is a need for a transceiver module which is highly reliable and durable. A print circuit board (PCB), the most important element of the transceiver module, must be enclosed by a shielding housing which absorbs electromagnetic radiation. This ensures that high frequency signals in the transceiver module do not affect external electrical circuits, and that such signals are not affected by external electromagnetic waves. The PCB must be grounded in order to dissipate any static charges which develop on the PCB.

U.S. Pat. No. 5,767,999 discloses a conventional optoelectronic transceiver module. The module comprises a top housing, a bottom housing and a PCB. The PCB is located between the top and the bottom housings. One end of the PCB connects with an electrical connector, and the other end of the PCB connects with optoelectrical components which have leads soldered to the PCB. Unfortunately, the PCB is fixed by plastic positioning dowels. Therefore the housing cannot be effectively connected to a grounding circuit of the PCB. There is no reliable grounding connection between the housing and the PCB. Any static charges on the housing cannot be timely dissipated to ground, which adversely affects the performance of the transceiver module. Furthermore, assembly of this conventional transceiver module is unduly laborious.

Another conventional optoelectronic transceiver module is disclosed in U.S. Pat. No. Re. 36,820. A PCB and other optoelectronic components are placed in a rectangular box. By injecting potting material into the box, the PCB and the optoelectronic components can be enclosed. The enclosure of the transceiver module fixes and protects the PCB. However, potting material is expensive and unduly troublesome to use. Furthermore, the structure does not provide satisfactory grounding connection between the PCB and the box. Thus the box does not effectively dissipate buildup of electrostatic charge thereon, and does not provide optimal electromagnetic shielding.

In view of the above, there is a need for a transceiver module which can easily and securely fix the PCB in a metal housing while simultaneously effectively establishing a grounding path between the PCB and the metal housing.

SUMMARY OF THE INVENTION

Therefore, one object of the present invention is to provide a transceiver module which can easily and securely fix a PCB in a housing.

Another object of the present invention is to provide a transceiver module with an effective grounding path between a PCB and a housing.

The transceiver module of the present invention comprises a housing, an optoelectronic subassembly, a receptacle, a chassis and a PCB. The optoelectronic subassembly is received in the receptacle. Conductive leads of the optoelectronic subassembly are soldered to the PCB. The chassis is attached to the PCB with screws, and accommodates and protects the PCB. The housing comprises a top housing and a bottom housing. The top housing is attached to the chassis and the receptacle. The top housing and the bottom housing are attached together, enclosing therein the receptacle, the chassis and the PCB.

DETAILED DESCRIPTION OF THE INVENTION

Figure 1:
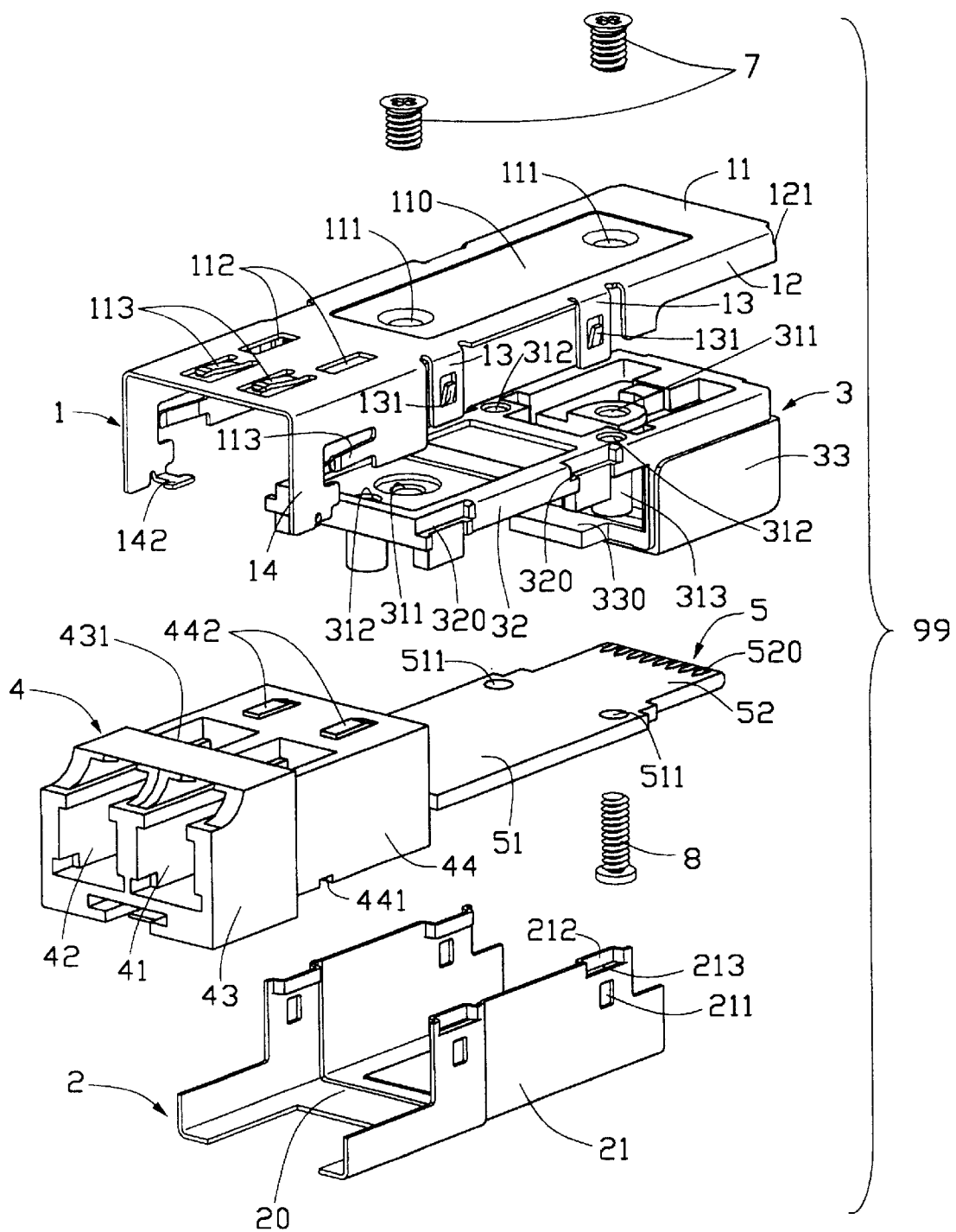
FIG. 1 is an exploded perspective view of an optoelectronic transceiver module in accordance with the present invention.

Referring to FIG. 1, an optoelectronic transceiver module 99 in accordance with the present invention has a top housing 1, a bottom housing 2, a chassis 3, a receptacle 4, a PCB 5 and an optoelectronic subassembly 6.

Figure 3:
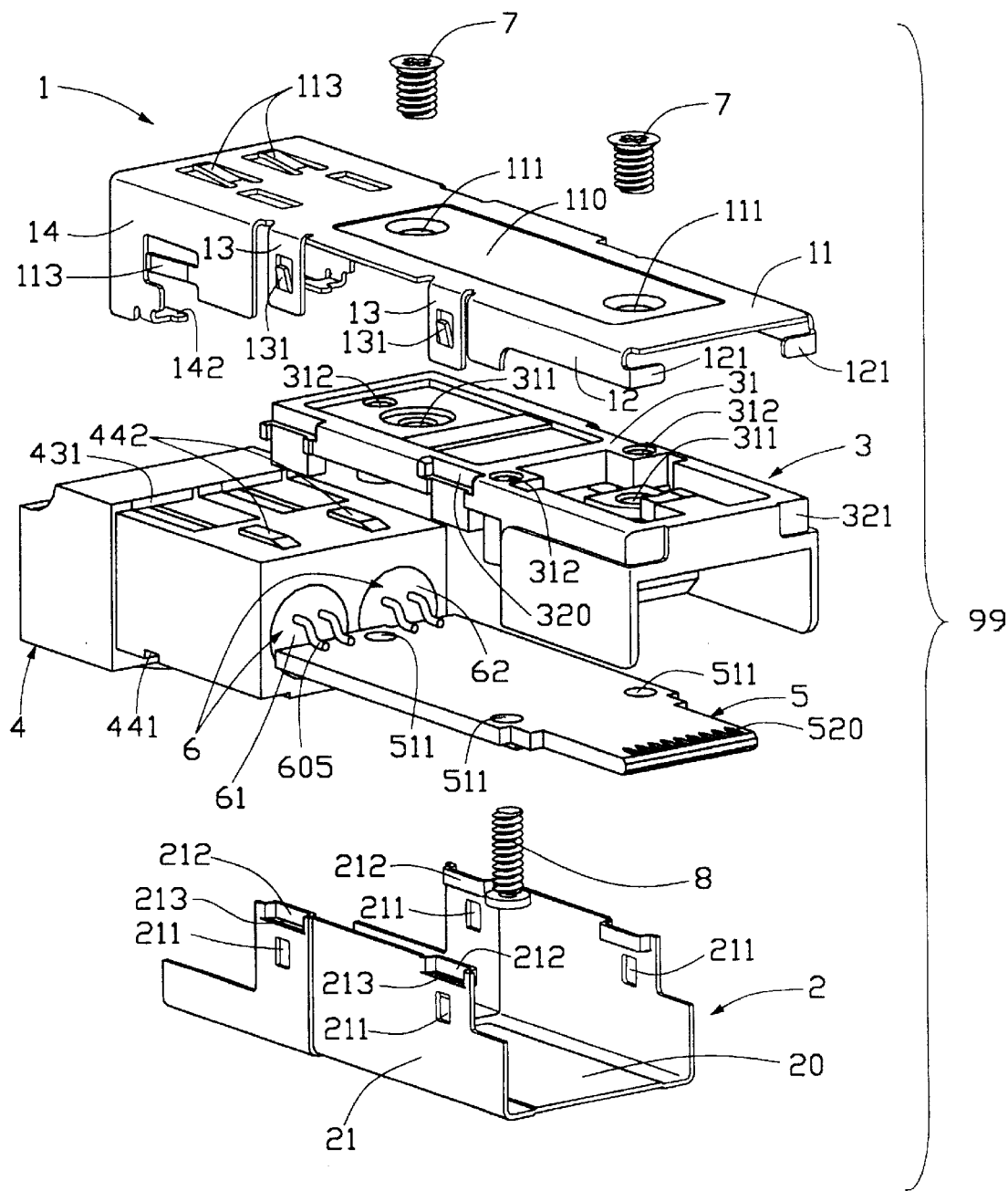
FIG. 3 is an exploded perspective view of the optoelectronic transceiver module of FIG. 1, but viewed from still another aspect.

The receptacle 4 has the shape of an oblong box. The receptacle 4 comprises a front portion 43 and a rear portion 44. The size of the front portion 43 is large than that of the rear portion 44. Thus a rear face 431 is defined on the front portion 43 around a periphery of a junction of the front and rear portions 43, 44, for abutting a front edge of the top housing 1. Referring also to FIG. 3, the front portion 43 defines two openings 41, 42 though the receptacle 4. Rear portions of the openings 41, 42 are for receiving the optoelectronic subassembly 6, and front portions of the openings 41, 42 are for connecting with an optical connector (not shown) to output optical signals. The optoelectronic subassembly 6 comprises a transceiver. The transceiver comprises a transmitter 61 and a receiver 62. The transmitter 61 may typically be a laser diode (LD) or light emitting diode (LED), and the receiver 62 may typically be a photo diode. A plurality of conductive leads 605 extends from a rear of the transceiver, and is soldered to the PCB 5. Two T-shaped grooves 441 are defined in a bottom surface of the rear portion 44 of the receptacle 4, for engagement of the receptacle 4 with the top housing 1. A pair of protuberances 442 is formed on a top surface of the receptacle 4.

Figure 2:
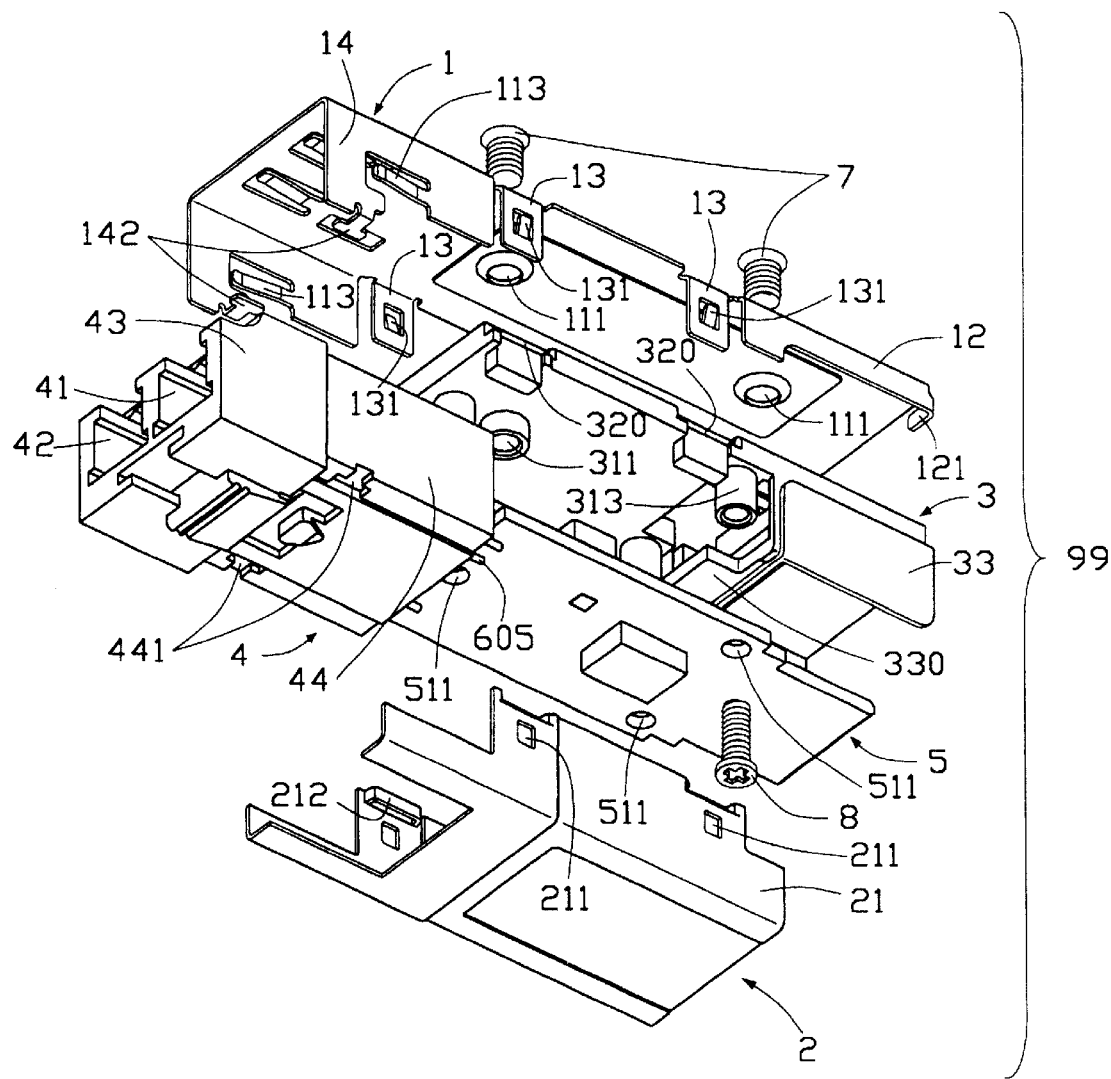
FIG. 2 is an exploded perspective view of the optoelectronic transceiver module of FIG. 1, but viewed from another aspect.

Referring also to FIG. 2, the PCB 5 has a narrow rear section 52 and a wide front section 51. Three position holes 511 are defined through the PCB 5 in the vicinity of three edges thereof respectively. The conductive leads 605 of the optoelectronic subassembly 6 are soldered to the front section 51 of the PCB 5, to establish electrical contact between the optoelectronic subassembly 6 and the PCB 5. The rear section 52 of the PCB 5 has a row of electrical contacts 520 at a rear end thereof, for electrical connection of the PCB 5 with an electrical connector (not shown).

The chassis 3 may be made of metal, plastic or other suitable material. The chassis 3 generally has the shape of an oblong box, for accommodating and protecting the PCB 5. Three poles 313 depend from a bottom face of the chassis 3. Three screw holes 312 are defined in a top face of the chassis 3 and through the three poles 313 respectively, corresponding to the three position holes 511 of the PCB 5. A rear of the chassis 3 forms a seat 33. A support plate 330 extends forwardly from a bottom of the seat 33. Two screw holes 311 are defined in the chassis 3. The chassis 3 has a pair of opposite side walls 32. Two spaced recesses 320 are defined at a top edge of each side wall 32, for engagement of the chassis 3 with the bottom housing 2. A pair of depressions 321 (see FIG. 3) is defined in opposite sides of a rear end of the chassis 3. Three fastening components, such as screws 8 (only one shown), are for fixing the PCB 5 on the chassis 3.

The bottom housing 2 is made of metal, and has a generally U-shaped configuration. The bottom housing 2 has a rectangular bottom wall 20, and two side walls 21 extending perpendicularly upwardly from the bottom wall 20. Two protrusions 212 are inwardly formed at front and rear ends of a top of each side wall 21, for engaging in the recesses 320 of the chassis 3. A slot 213 is defined below each protrusion 212 of each side wall 32. A rectangular opening 211 is defined in each side wall 21 below each slot 213. The slots 213 and the rectangular openings 211 are for mating with the top housing 1.

The top housing 1 is made of metal, and has a top wall 11. A shallow trough 110 is formed at a middle of the top wall 1. Two annular flanges (not labeled) extend downwardly from the trough 110. Two position holes 111 are respectively defined within the annular flanges, corresponding to the screw holes 311 of the chassis 3. A pair of parallel grounding tabs 113 is formed near a front end of the top wall 11 of the top housing 1. A pair of parallel rectangular openings 112 is defined between the grounding tabs 113 and the trough 110, corresponding to the protuberances 442 of the receptacle 4. A pair of forward side walls 14 depends from opposite sides of the top wall 11 of the top housing 1. A pair of rearward side walls 12 depends from opposite sides of the top wall 11 of the top housing 1. Two pairs of locking tabs 13 respectively depend from opposite sides of the top wall 11 of the top housing 1, between the forward and rearward side walls 14, 12. A T-shaped flap 142 is inwardly formed at a bottom of each forward side wall 14, for engaging in the T-shaped grooves 441 of the receptacle 4. Each forward side wall 14 has a grounding tab 113. A tab 121 (best seen in FIG. 3) extends inwardly from a rear end of each rearward side wall 12, for engaging in the depressions 321 of the chassis 3. Each locking tab 13 is a rectangular plate, the size of which corresponds to each slot 213 of the bottom housing 2. A spring tongue 131 is outwardly formed at a center of each locking tab 13. A lower end of each spring tongue 131 is integrally joined with the locking tab 13, and an upper end of each spring tongue 131 protrudes outwardly from the locking tab 13. Two fastening components, such as screws 7, are for attaching the top housing 1 to the chassis 3.

Figure 4:
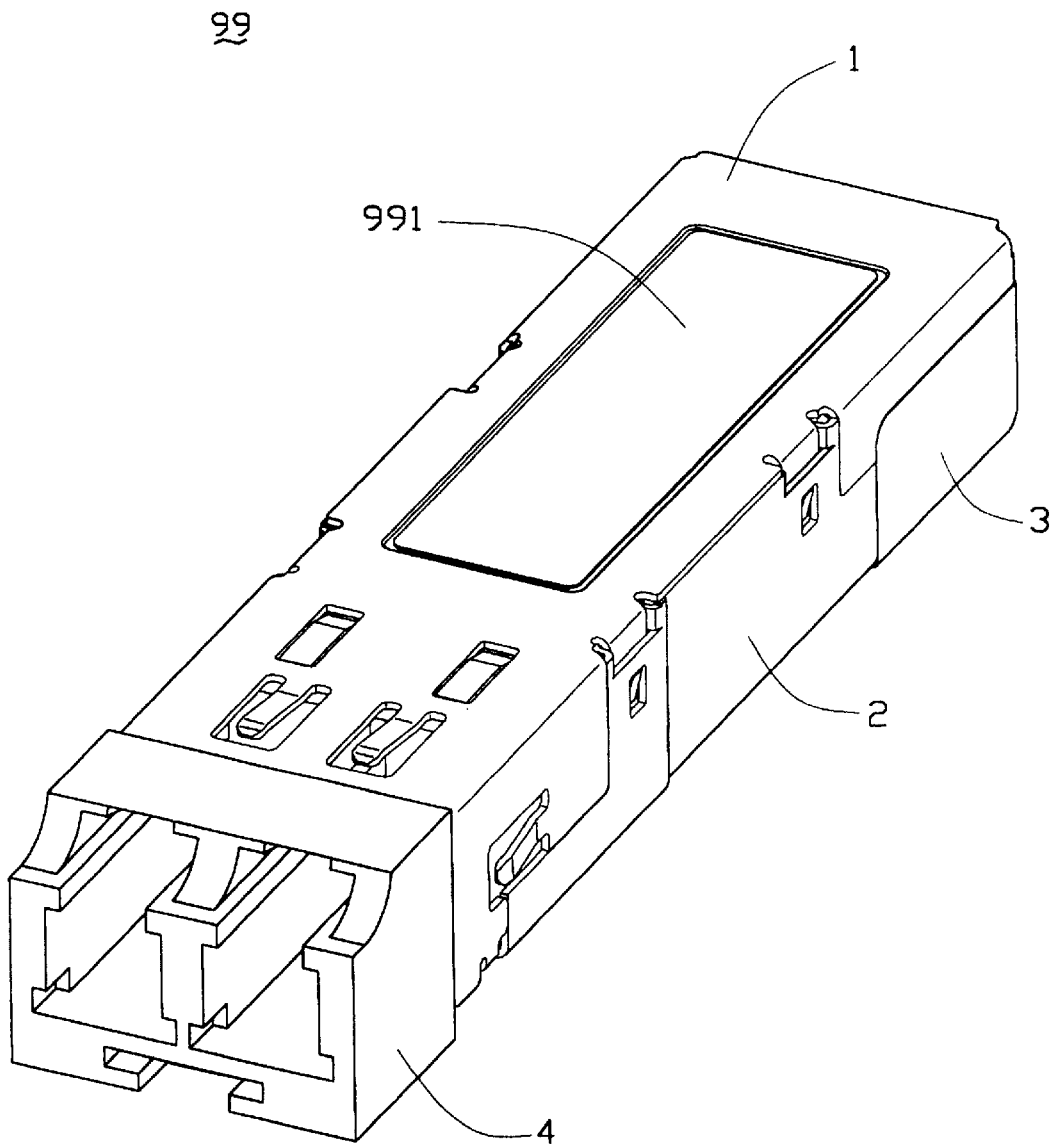
FIG. 4 is an assembled view of the optoelectronic transceiver module of FIG. 1.

Referring to FIG. 4, a labeling tape 991 is for attachment to the optoelectronic transceiver module 99 after assembly.

In assembly of the optoelectronic transceiver module 99, the PCB 5 and the chassis 3 are firstly attached together. The rear section 52 of the PCB 5 is inserted into the seat 33 of the chassis 3. The poles 313 of the chassis 3 press down on the PCB 5, and the support plate 330 of the chassis 3 supports the PCB 5 by abutting against a bottom face thereof. The screws 8 are extended through the position holes 511 of the PCB 5 to threadedly engage in the screw holes 312 of the poles 313. The top housing 1 is then attached to the receptacle 4 and the chassis 3. The screws 7 are extended through the position holes 111 of the top housing 1 to threadedly engage in the screw holes 311 of the chassis 3. The protuberances 442 of the receptacle 4 are received in the openings 112 of the top housing 1. The T-shaped flaps 142 of the top housing 1 are engaged in the T-shaped grooves 441 of the receptacle 4. Finally, the bottom housing 2 is attached to the chassis 3 and the top housing 1. The locking tabs 13 of the top housing 1 are extended through the slots 213 of the bottom housing 2 until the spring tongues 131 of the locking tabs 13 engage in the openings 211 of the bottom housing 2. The protrusions 212 of the bottom housing 2 are engaged in the recesses 320 of the chassis 3. FIG. 4 shows the finally assembled optoelectronic transceiver module 99. The labeling tape 991 is glued to the trough 110 of the top housing 1, to show some information about the optoelectronic transceiver module 99 and to cover the screws 7.

The chassis 3 of the optoelectronic transceiver module 99 is preferably made of metal. The PCB 5 at the position holes 511 is coated with conductive material, and the conductive material is connected with a grounding circuit of the PCB 5. The chassis 3 is thus electrically connected with the grounding circuit of the PCB 5 via the screws 8 which engage with the conductive coating at the position holes 511. The top and bottom housings 1, 2 electrically contact with the chassis 3. The optoelectronic transceiver module 9 thus effectively forms a grounding path between the grounding circuit of the PCB 5 and the top and bottom housings 1, 2. Thus any static charge which develops on the top or bottom housings 1, 2 is effectively dissipated.

It should be understood that various changes and modifications to the presently preferred embodiment described herein will be apparent to those skilled in the art. Such changes and modifications may be made without departing from the spirit and scope of the present invention and without diminishing the present invention's advantages. Thus, it is intended that such changes and modifications be covered by the appended claims.

What is claimed is:

1. An optoelectronic transceiver module comprising:
   an optoelectronic subassembly for receiving and sending optical signals, the optoelectronic subassembly having a plurality of conductive leads;
   a receptacle including at least one opening receiving the optoelectronic subassembly, the conductive leads of the optoelectronic subassembly extending from a rear face of the receptacle;
   a printed circuit board electrically contacting with the conductive leads of the optoelectronic subassembly, at least one hole being defined in the circuit board, the circuit board at the least one hole being coated with conductive material electrically connected with a grounding circuit of the circuit board;
   a metal chassis;
   at least one fastening component extending through the at least one hole of the print circuit board, fixing the circuit board on the chassis, and electrically connecting the grounding circuit of the circuit board with the chassis; and
   at least one metal housing enclosing the circuit board and the chassis, and electrically connecting with the chassis.

2. The optoelectronic transceiver module as described in claim 1, wherein the conductive leads are soldered to the circuit board.

3. The optoelectronic transceiver module as described in claim 1, wherein the receptacle includes a front portion and a rear portion, and a rear face is formed on the front portion between the front portion and the rear portion.

4. The optoelectronic transceiver module as described in claim 3, wherein the rear portion of the receptacle includes a bottom surface defining at least one groove.

5. The optoelectronic transceiver module as described in claim 1, wherein the receptacle has a top surface forming at least one protuberance.

6. The optoelectronic transceiver module as described in claim 1, wherein the chassis defines at least one screw hole corresponding to the at least one hole of the circuit board.

7. The optoelectronic transceiver module as described in claim 6, wherein the at least one screw hole is defined in at least one pole depending from a bottom of the chassis.

8. The optoelectronic transceiver module as described in claim 7, wherein a rear of the chassis includes a seat and a support plate extending forwardly from a bottom of the seat.

9. The optoelectronic transceiver module as described in claim 8, wherein a section of the circuit board is inserted into the seat, the at least one pole presses down on the circuit board, and the support plate supports the circuit board.

10. The optoelectronic transceiver module as described in claim 1, wherein the chassis comprises two side walls, and each side wall defines at least one recess.

11. The optoelectronic transceiver module as described in claim 10, wherein the housing includes at least one protrusion engagingly received in the at least one recess of the chassis.

12. The optoelectronic transceiver module as described in claim 1, wherein each fastening component is a screw.

* * * * *